(12) United States Patent
Hsu et al.

(10) Patent No.: US 6,778,447 B2
(45) Date of Patent: Aug. 17, 2004

(54) EMBEDDED DRAM SYSTEM HAVING WIDE DATA BANDWIDTH AND DATA TRANSFER DATA PROTOCOL

(75) Inventors: Louis L. Hsu, Fishkill, NY (US); Rajiv V. Joshi, Yorktown Heights, NY (US); Jeremy Stephens, New Windsor, NY (US); Daniel Storaska, Walden, NY (US)

(73) Assignee: International Business Machines Corporation, Armonk, NY (US)

( * ) Notice: Subject to any disclaimer, the term of this patent is extended or adjusted under 35 U.S.C. 154(b) by 166 days.

(21) Appl. No.: 10/062,972

(22) Filed: Jan. 31, 2002

(65) Prior Publication Data

US 2003/0142558 A1 Jul. 31, 2003

(51) Int. Cl.[7] ............................................. G11C 7/00
(52) U.S. Cl. ..................... 365/189.08; 365/189.01; 365/189.05; 365/193; 365/63; 365/72; 711/104
(58) Field of Search ................. 365/189.01, 189.05, 365/189.08, 63, 72, 193

(56) References Cited

U.S. PATENT DOCUMENTS

| | | | | |
|---|---|---|---|---|
| 5,877,992 A | * | 3/1999 | Wu et al. | 365/200 |
| 5,930,194 A | * | 7/1999 | Yamagata et al. | 365/230.03 |
| 5,959,911 A | * | 9/1999 | Krause et al. | 365/201 |
| 5,973,529 A | * | 10/1999 | Chappell et al. | 327/200 |
| 6,049,501 A | * | 4/2000 | Pantelakis et al. | 365/230.03 |
| 2001/0030896 A1 | * | 10/2001 | Ooishi | 365/200 |
| 2002/0194425 A1 | * | 12/2002 | Penchuk | 711/105 |
| 2003/0043657 A1 | * | 3/2003 | Shau | 365/200 |
| 2003/0123278 A1 | * | 7/2003 | Anand et al. | 365/149 |
| 2003/0145158 A1 | * | 7/2003 | Hsu et al. | 711/104 |

FOREIGN PATENT DOCUMENTS

JP          02003007084      *  1/1993

* cited by examiner

Primary Examiner—Viet Q. Nguyen
(74) Attorney, Agent, or Firm—Louis J. Percello; Dilworth & Barrese, LLP

(57) ABSTRACT

A self-timed data communication system for a wide data width semiconductor memory system having a plurality of data paths is provided. The data communication system includes a central data path including at least one junction circuit configured for exchanging data signals between the central data path and the plurality of data paths of the at least one data path. A respective one junction circuit of the at least one junction circuit includes circuitry for controlling resetting the respective one junction circuit for preparation of a subsequent data transfer through the respective one junction circuit in accordance with receipt of an input junction monitor signal indicating that data has been transferred to the respective one junction circuit. The data communication system further includes a plurality of data banks configured for storing data, wherein a corresponding data bank of the plurality of data banks is connected to a respective one data path of the plurality of data paths. The data communication system further includes circuitry for controlling the respective one data path in accordance with receipt of a monitor signal indicating that a data transfer operation has been initiated for transfer of data from the respective one data path. The circuitry for controlling includes circuitry for generating a control signal for controlling resetting of the respective one data path after data is transferred for preparation of a subsequent data transfer operation.

28 Claims, 12 Drawing Sheets

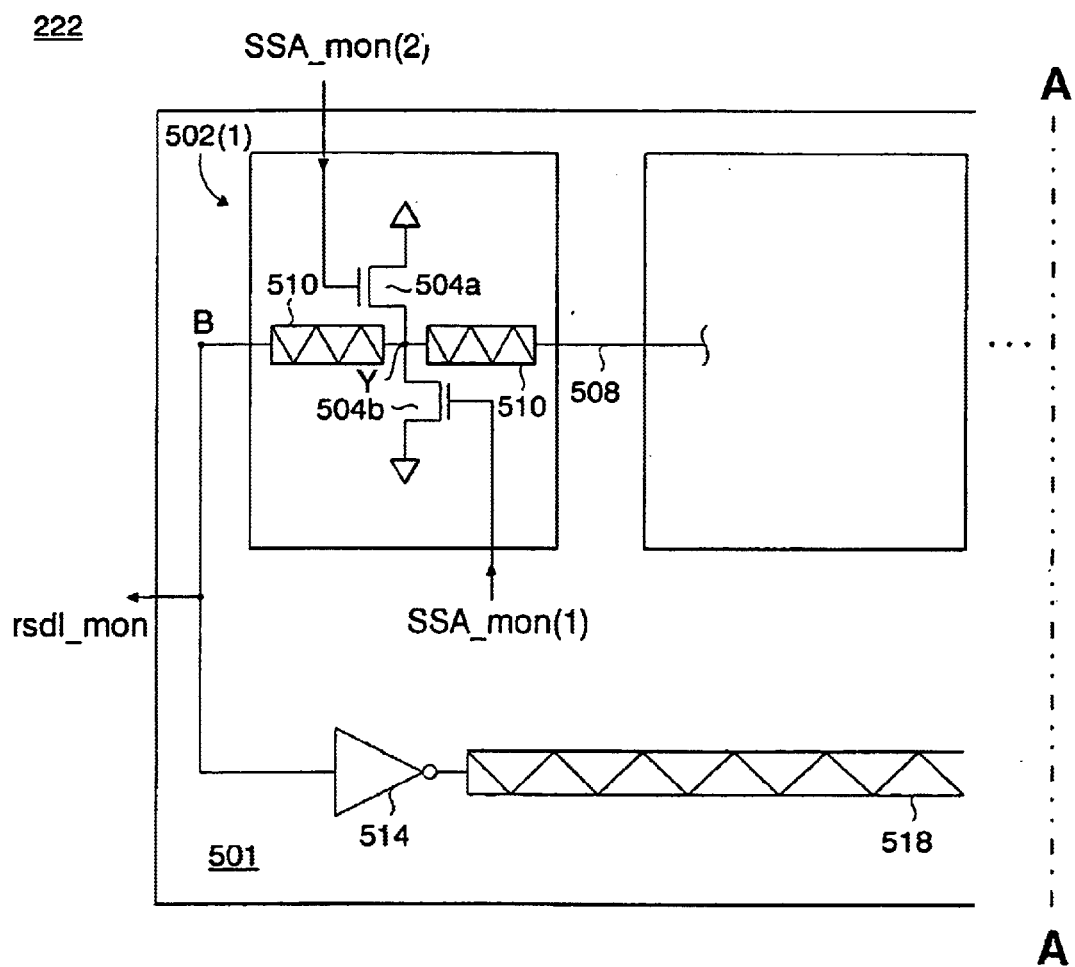
FIG. 5A(1)

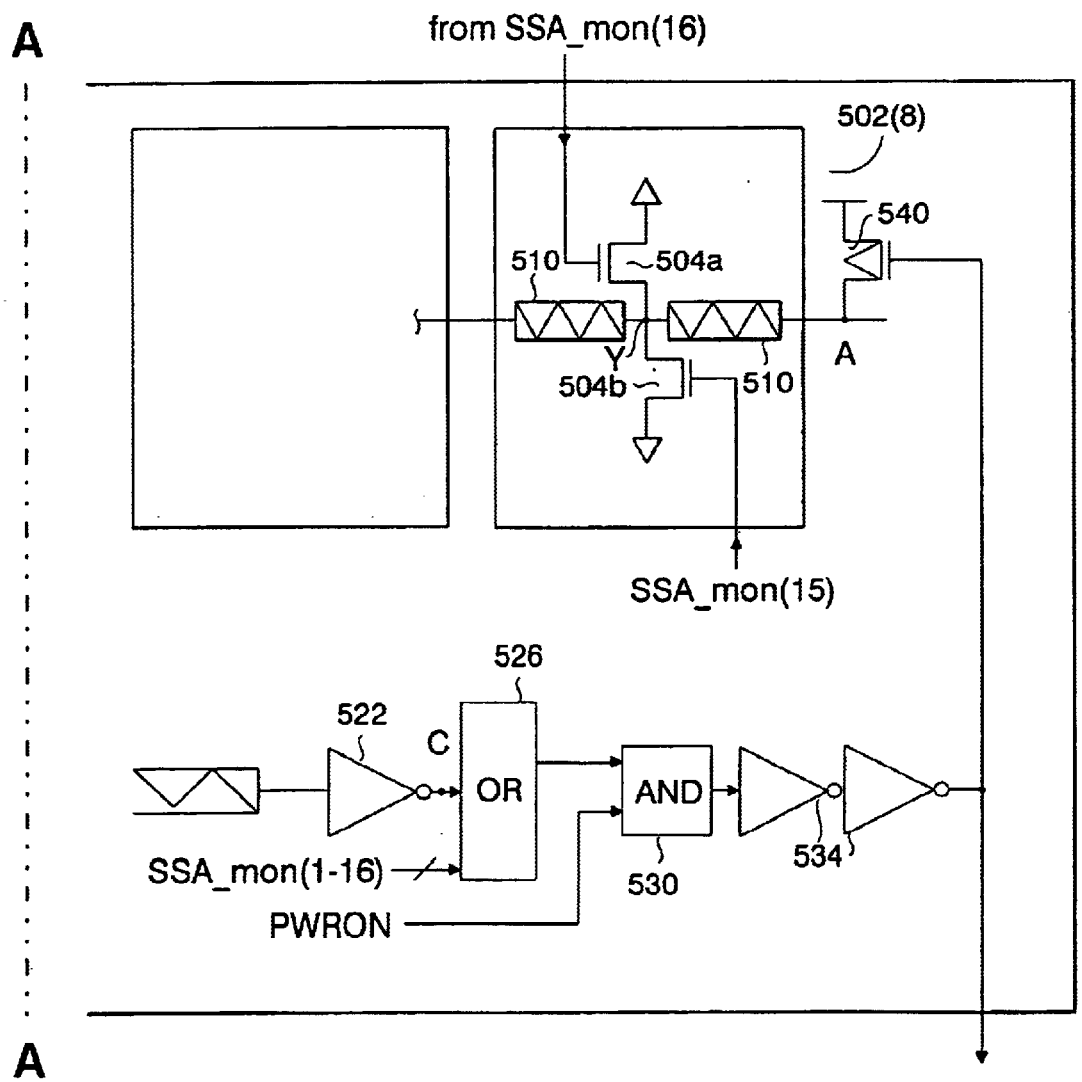
FIG. 5A(2)

EMBEDDED DRAM SYSTEM HAVING WIDE DATA BANDWIDTH AND DATA TRANSFER DATA PROTOCOL

FIELD OF THE INVENTION

This invention relates to the field of integrated circuit (IC) design. Specifically, it relates to a an embedded DRAM (eDRAM) system having a micro-cell architecture, a wide data bandwidth and a wide internal bus width implementing a high-speed, high-quality data protocol for data transfer operations.

BACKGROUND OF THE INVENTION

Embedded DRAMs (eDRAMs) with wide data bandwidth and wide internal bus width have been proposed to be used as L2 (level-2) cache to replace pure SRAM cache. Since each DRAM memory cell is formed by a transistor and a capacitor, the size of DRAM cache is significantly smaller than that of SRAM cache. In order to meet performance requirements, an eDRAM is formed of a plurality of blocks or micro-cells. A bank is comprised of one or more blocks. A block is a small DRAM array unit formed by a plurality of wordlines (e.g., from 64 to 256) and a plurality of bitline pairs (e.g., from 64 to 256). The size of a block is much smaller (e.g., 16× to 256×) than that of a bank of a conventional stand-alone DRAM. Typically one bank of each eDRAM bank is activated at a time. It is possible for blocks from different banks to be accessed simultaneously for simultaneous read and write operations. The read and write speed of an eDRAM can be fast due to very light loading of wordlines and bitlines.

An SRAM array is provided for effectively utilizing the large eDRAM cache size. The SRAM array, similar in size to an eDRAM block, is provided for serving as a cache interface in-between the eDRAM bank(s) and one or more processors and for facilitating a high-speed pipeline operation in the eDRAM The wide internal bus (64–1024 Bits) is provided for transferring data between the eDRAM, SRAM and processor(s). Due to the high density of the wide internal bus, certain wiring regions for control and data lines are very small and difficult for providing a circuit layout.

To illustrate the high density of data transfer performed by the wide internal bus, the data bus includes read data lines (e.g., 144 read data lines) plus redundant data lines (e.g., 8 redundant data lines forming a total of 152 data lines in the read data bus). Data is transferred from an eDRAM micro-cell upon activation by a wordline. The data is first amplified by primary sense amplifiers and then by corresponding secondary sense amplifiers. The data is then passed through the read data bus to a central neck region for passing through a column redundancy switch circuit, and then on to an SRAM macro. As the data approaches the central neck region, it passes through congested areas in which data paths converge.

Accordingly, a need exists for providing a compact eDRAM system having a wide data bandwidth, high-capacity storage, and data paths conducive to high-speed and high-integrity read operations. Furthermore, a need exists for a read data protocol for directing stored data through data paths for achieving high-speed and high-integrity read operations in a high-capacity embedded DRAM macro having a wide data bandwidth. Furthermore, a need exists for a method and system for allowing sufficient time to accurately read data stored in a far location, and to prevent wasting time when reading data stored in a near location.

SUMMARY

An aspect of the present invention is to provide a compact eDRAM system having a wide data bandwidth, high-capacity storage, and data paths conducive to high-speed and high-integrity read operations.

Another aspect of the present invention is to provide a read data protocol for directing stored data through read data paths for achieving high-speed and high-integrity read operations in a high-capacity embedded DRAM macro having a wide data bandwidth.

Another aspect of the present invention is to provide a method and system for allowing sufficient time to accurately read data stored in a far location, and to prevent wasting time when reading data stored in a near location.

Accordingly, a self-timed data communication system for a wide data width semiconductor memory system having a plurality of data banks configured for storing data is provided. The data communication system includes circuitry for transferring data having a plurality of data paths, wherein a corresponding data bank of the plurality of data banks is connected to a respective one data path of the plurality of data paths, and circuitry for controlling the respective one data path in accordance with receipt of a monitor signal indicating that a data transfer operation has been initiated for transfer of data to or from the respective one data path. The circuitry for controlling generates a control signal for controlling resetting of the respective one data path after data is transferred for preparation of a subsequent data transfer operation.

The circuitry for transferring data further includes a central data path including at least one junction circuit configured for exchanging data signals between the central data path and at least one data path of the plurality of data paths. A respective one junction circuit of the at least one junction circuit includes circuitry for controlling resetting the respective one junction circuit for preparation of a subsequent data transfer through the respective one junction circuit in accordance with receipt of an input junction monitor signal indicating that data has been transferred to the respective one junction circuit.

BRIEF DESCRIPTION OF THE FIGURES

FIG. 5A is a block circuit diagram of the APC pulse generator according to the present invention;

DETAILED DESCRIPTION OF THE INVENTION

The present invention provides a high capacity embedded DRAM (eDRAM) system having a micro-cell architecture, a wide data bandwidth and wide internal bus width, and data paths configured for implementing a read data protocol for achieving high-speed and high-integrity read operations. A description will now be given as to the structure and operation of an exemplary high capacity embedded DRAM macro.

Figure 1:
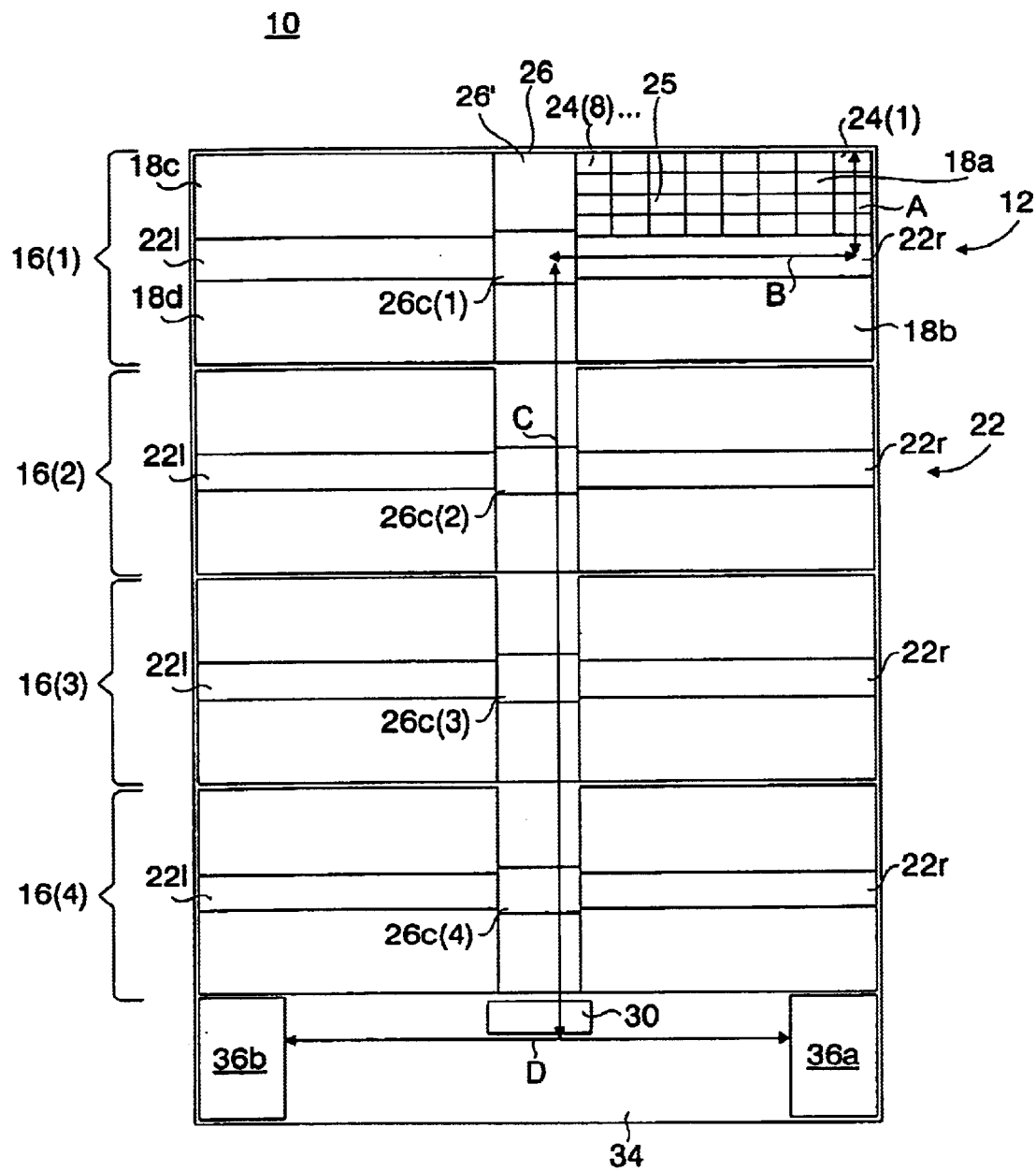
FIG. 1 is a block diagram of an exemplary eDRAM system having a micro-cell architecture according to the present invention.

With reference to FIG. 1, there is shown a block diagram of an exemplary high-capacity eDRAM system having a micro-cell architecture designated generally by reference numeral 10. The eDRAM system 10 includes an array of DRAM blocks 12. In the example shown in FIG. 1, the array 12 includes four blocks 16a–d storing 4 Mb of data each.

Each of the blocks 16a–d includes four 1 Mb arrays 18a–d. Two 1 Mb arrays 18a,b, indicated as portion 20, are located on upper and lower corners, respectively, of the right side of each block 16a–d. The other two 1 Mb arrays 18c,d, symmetric to 18a,b, are located on upper and lower corners, respectively, of the left side of each block 16a–d. Arm regions 22, including right and left arm regions 22r,l, respectively, are located in each block 16a–d, with the right arm 22r located between the upper array 18a and the lower array 18b of portion 20, and the left arm 22l located between the upper array 18c and the lower array 18d.

A central spine 26 is formed in between the arrays on the left 18c, 18d and the arrays on the right 18a, 18b of the blocks 16a–d, forming a central read data path for data and control signals. Within the central spine 26, in between each pair of left and right arrays 18a,c and 18b,d is formed a shoulder region 30. Data flowing from a pair of left and right arms is directed through the associated shoulder region 30. Data flowing from each shoulder region 30 is directed through the central spine 26 to a lower shoulder region 30 located closer to a head region 34 to be described below. Thus, each shoulder region 30 (with the exception of a top shoulder region 30T) is receiving data from a shoulder region 30 above and from associated right and left arms. The shoulder region 30 is small and its circuit layout is designed for compactness.

The eDRAM system 10 as indicated above further includes the head region 34 located below the blocks 16a–16d. The head region 34 houses a small SRAM array similar in size to an eDRAM block for providing a cache interface between the eDRAM blocks 16a–d and one or more processors. Included in the SRAM array are two single-port SRAM macros 36a,b, which are provided for simultaneous read and write operations. The head region 34 further houses a column redundancy switch circuit 40 for determining whether data being transferred is transferred to (or from) normal data lines or to (or from) redundant data lines, as is known in the art. The read data path provided in the central spine 26 provides an internal read data bus for transferring data between the eDRAM blocks, the SRAM array and one or more processors. The internal read data bus typically has a width of 64 to 1024 bytes.

FIG. 1 shows an exemplary read data path including paths A–D for transferring data during a read operation. Path A is the path for data being transferred from cells in block 18a when a wordline of block 18a is activated for a read operation. The data is first amplified by primary sense amplifiers and then by corresponding secondary sense amplifiers, as is known in the art. Path B is the path for transferring the data from path A by way of arm region 22r to the adjacent shoulder region 30. Path C is the path for transferring data from the shoulder region 30 along the central spine 26 to the head region 34. Path D is the path for transferring data through the column redundancy switch circuit 40 and then to one of the SRAM macros 36a,b of the SRAM array. Similarly, FIG. 1 shows an exemplary write data path including paths D–A for transferring data during a write operation.

Figure 2:
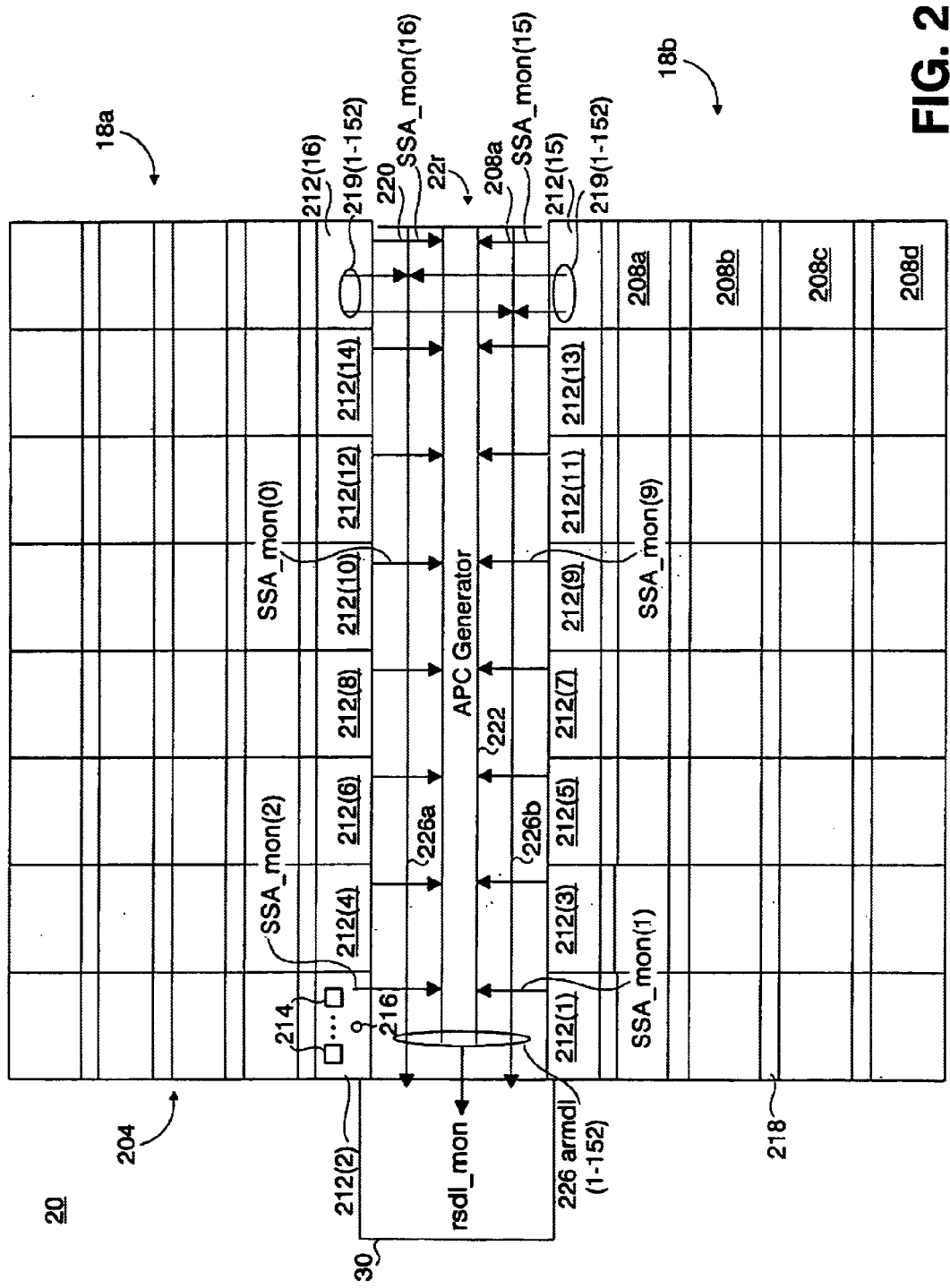
FIG. 2 is a block diagram of upper and lower arrays of a block in a micro-cell DRAM array according to the present invention.

With reference to FIG. 2, the portion 20 forming the right side of one of the blocks 16a–d is shown. It is to be understood that the left side of the blocks 16a–d are symmetric with the portion 20 shown, and are structured and operate substantially the same as shown and described in the figures and in the following description. The portion 20 includes the upper and lower arrays 18a, 18b of the right side of the block, and the associated arm 22r positioned between the upper and lower arrays 18a, 18b. Each left and right side of each block 16a–d is similar to the portion 20 shown. The portion 20 includes 16 banks 204, each bank 204 formed of a 128K array including an array of four stacked micro-cells 208a–d and an associated secondary sense amplifier (SSA) block 212(n), where n=1 to 16, located at the base of the bank 204. The upper array 18a is formed of SSA blocks 212(2,4,6,8,10,12,14,16), and the lower array 18b is formed of SSA blocks 212(1,3,5,7,9,11,13,15). The arm 22r includes an arm pre-charge (APC) pulse generator 222 and an arm read data path 226 including, in this example, 144 arm read data lines in addition to 8 redundant arm read data lines of the right arm, totaling 152 arm read data lines armdlr(n), where n=1 to 152, (see FIG. 3). Similarly, a left side portion has 152 arm read data lines of the left arm armdll(n), where n=1 to 152), (see FIG. 3).

A primary sense amplifier (PSA) 218 is provided in association with each micro-cell 208a–d, for sensing and amplifying data being read from the micro-cell 208a–d during a read operation. Each SSA block 212(n) includes 152 SSA's 214 in data communication with a respective one of the 152 arm read data lines armdlr(1–152), and one monitor SSA 216. During a read operation, each SSA 214 senses and amplifies data that was sensed by the primary sense amplifiers 218 included in the associated bank 204 and outputs a "high" or "low" signal indicative of the value being read from the micro-cell 208a–d. The data sensed by each SSA 214 is output via an SSA data line of the right arm (dlr) 219(n), where n=1 to 152. Each monitor SSA 216 generates an active "high" monitor pulse signal SSA_mon (n), where n=1 to 16, each time a read command is executed. The SSA_mon(1–16) pulse signal is output via a SSA_mon data line 220.

During a write operation, data transferred from the arm write data lines to a micro-cell 208a–d is transferred via the SSA block 212(n) associated with the block 204 of the micro-cell 208a–d and the PSA 218 associated with the micro-cell 208a–d.

It is to be understood that the size of the eDRAM system 10 including, for example, the number of blocks, banks per block, read data bus width and size of each bank, can be set to smaller or larger values than the exemplary system shown in the Figures.

The APC pulse generator 222 extends across the arm region 22r and it is positioned directly above or below each bank 104 for receiving the SSA_mon (1–n) pulse signals via each of the SSA_mon dlrs 220. During a read operation, upon receiving the SSA-mon (1–n) pulse signals, the APC pulse generator 222 generates an APC pulse signal. The APC pulse signal controls resetting of the arm read data path 226 in the arm region 22 after the data being read has been transmitted down the arm read data path 226. The APC pulse generator 222 also generates and transmits a read data line monitor (rsdl_mon) pulse signal to the shoulder region 30 for controlling resetting of the data lines that feed into the shoulder and spine regions 30, 26. The rsdl_mon(r) and the rsdl_mon(l) pulse signals (see FIG. 6) are the rsdl_mon pulse signals generated by the APC pulse generator located in each of the right arm regions 22r and left arm regions 22l, respectively.

The 152 SSA's 214 of each SSA block 212 provide sensed output signals to the arm read data path 226 that runs along the arm region 22. The arm read data path 226 is divided into first and second read data paths 226a, 226b, respectively. A first portion of the sensed output data signals, including 76 signals, from the SSA's 214 are provided to the first read data path 226a, and a second portion of the sensed output data signals, including 76 signals, from the SSA's 214 are provided to the second read data path 226b.

In operation, during execution of a read command, one bank at a time receives a read signal. The SSA block 212(n) corresponding with the bank receiving the read signal outputs an SSA_mon(n) pulse signal to the APC pulse generator 222 for controlling the pre-charge of the data lines of the read data path after the read data is transmitted. The SSA block 212(n) of the bank receiving the read signal further outputs the sensed output data signals signals, which provide 152 signals in total to the first and second read data paths 226a,b, i.e., data lines armdlr(1–152). As will be described below, the first and second data paths 226a,b provide data from the arm 22l to the shoulder region 30 for propagation through the central spine 26 to the head region 34.

Figure 3:
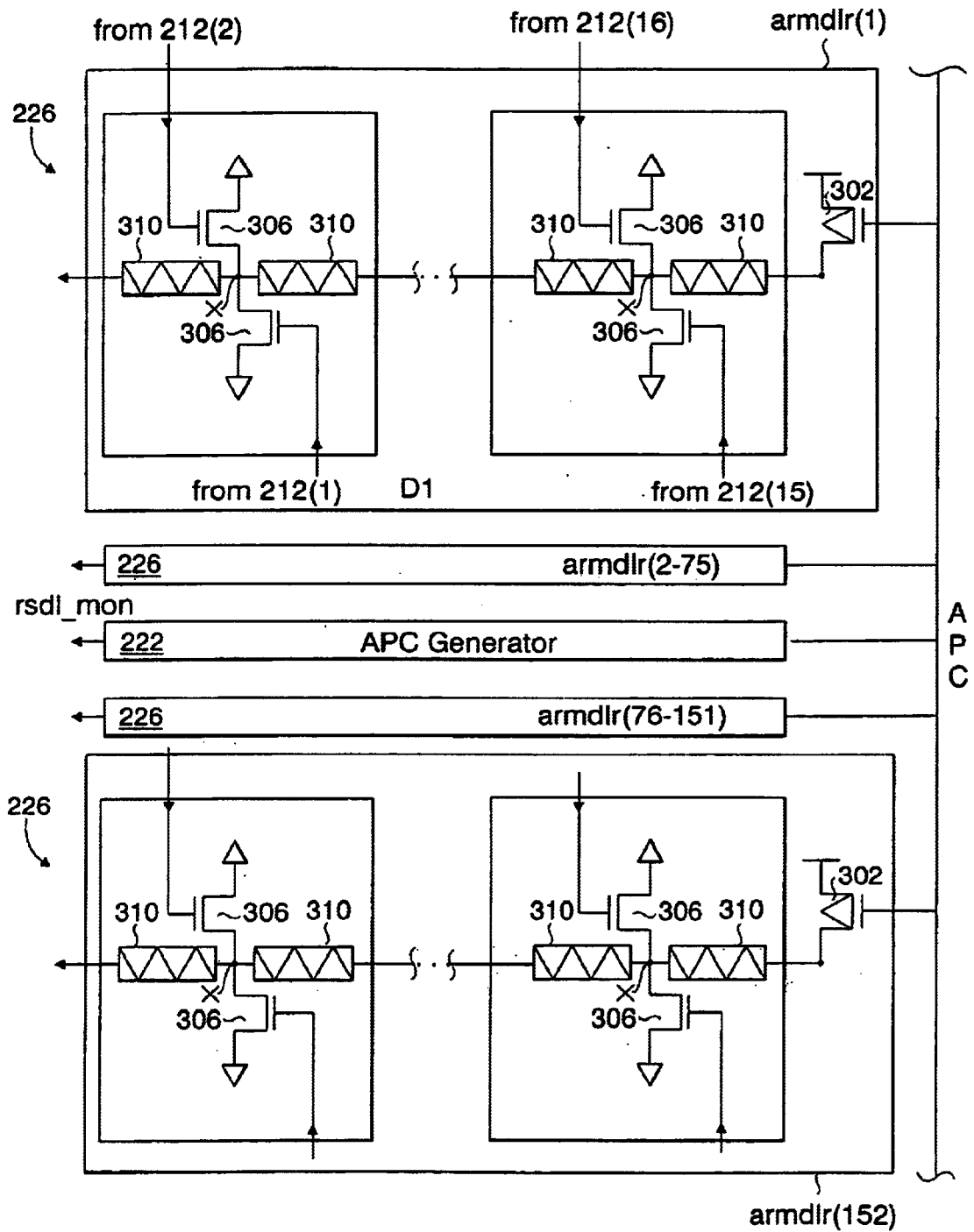
FIG. 3 is a block diagram of a dynamic read data path in an arm region lying between the upper and lower arrays according to the present invention.

With reference to FIG. 3, the read data path 226 in the right arm region 22r associated with is shown. It is to be understood that the read data path in the left arm region 22l is symmetric with the read data path 226 shown, and the operation is the substantially the same. Likewise, the structure and operation of the arm regions 22r,l within other blocks within the e-DRAM system 10 are substantially the same as described with reference to the right arm region 22r shown in FIG. 3. Each of the data lines armdlr(n) of the read data path 226 is a dynamic data line provided with pre-charge devices 302. Each pre-charge device 302 is typically a pMOS FET. Each data line armdlr(n) of the arm read data path 226 is provided with 8 connected pairs of discharge devices 306, each single discharge device 306 being associated with one respective SSA block 212(n) of the sixteen SSA blocks 212(1–16). Each discharge device 306 is typically an nMOS FET.

Each discharge device pair is formed so that the output of each discharge device 306 of the pair is connected at a node X located on the corresponding data line (n), a first and second resistive element 310 is provided on the data line (n) before and after node X, respectively. The first and second resistive elements 310 may be similar or different elements relative to each other.

Each pre-charge device 302 is controlled by the APC pulse signal. When the APC pulse signal is a logic "low", the pre-charge devices 302 charge the data lines armdlr(1–152) to a logic "high". The data lines armdlr(1–152) of the arm read data path 226 are initialized by pre-charging them to a logic "high". After each read operation, the data lines armdlr(1–152) of the arm read data path 226 are again pre-charged to a logic "high", the timing of which is controlled by circuitry within the APC pulse generator 222, as is discussed below with respect to FIGS. 5A, 5B.

Each discharge device 306 is controlled by the signal output by a corresponding one of the SSA's 214. When the SSA 214 provides a signal indicative of a "high" value, the discharge device 306 causes the charge on the data line 152(n) to be discharged for transferring the signal along the arm read data path 226 in the arm 22r to the read data path in the shoulder region 30. Each of the 152 data lines armdlr(1–152) of the read data path 26 has sixteen associated discharge devices 306, each of the discharge devices 306 is controlled by a respective SSA 214 from each of the 16 SSA blocks 212(1–16).

During a read operation, each "high" signal output by one of the SSA's 214 triggers a corresponding one of the discharge devices 306 to cause an active "low" data signal to be transferred along the associated data line armdlr(n) towards the shoulder region 30. As the data signal is transferred along the respective data line armdlr(n), it passes through each node X and its associated resistive elements 310 located along the data line armdlr(n) and nearer to the shoulder region 30. Thus, a data signal transferred via a discharge device 306 associated with a bank 204 located far from the shoulder region 30 has a longer path and a longer propagation time than a data signal transferred from a discharge device 306 associated with a bank 204 closer to the shoulder region 30. Sufficient time must be provided to allow transfer of the data signals traveling a longer path and having a longer propagation time before pre-charging the data lines armdlr (1–152) to prepare for the next read operation. However, it is desirable to transfer data signals having a shorter path and a shorter propagation time and pre-charge the data lines armdlr(1–152) without a delay to prepare for the next read operation, to avoid wasting time between read operations. The timing of the data transferring and the pre-charging of the data lines armdlr(1–152) is controlled within the APC pulse generator 222 as described below with respect to FIGS. 5A, 5B.

Figure 4:
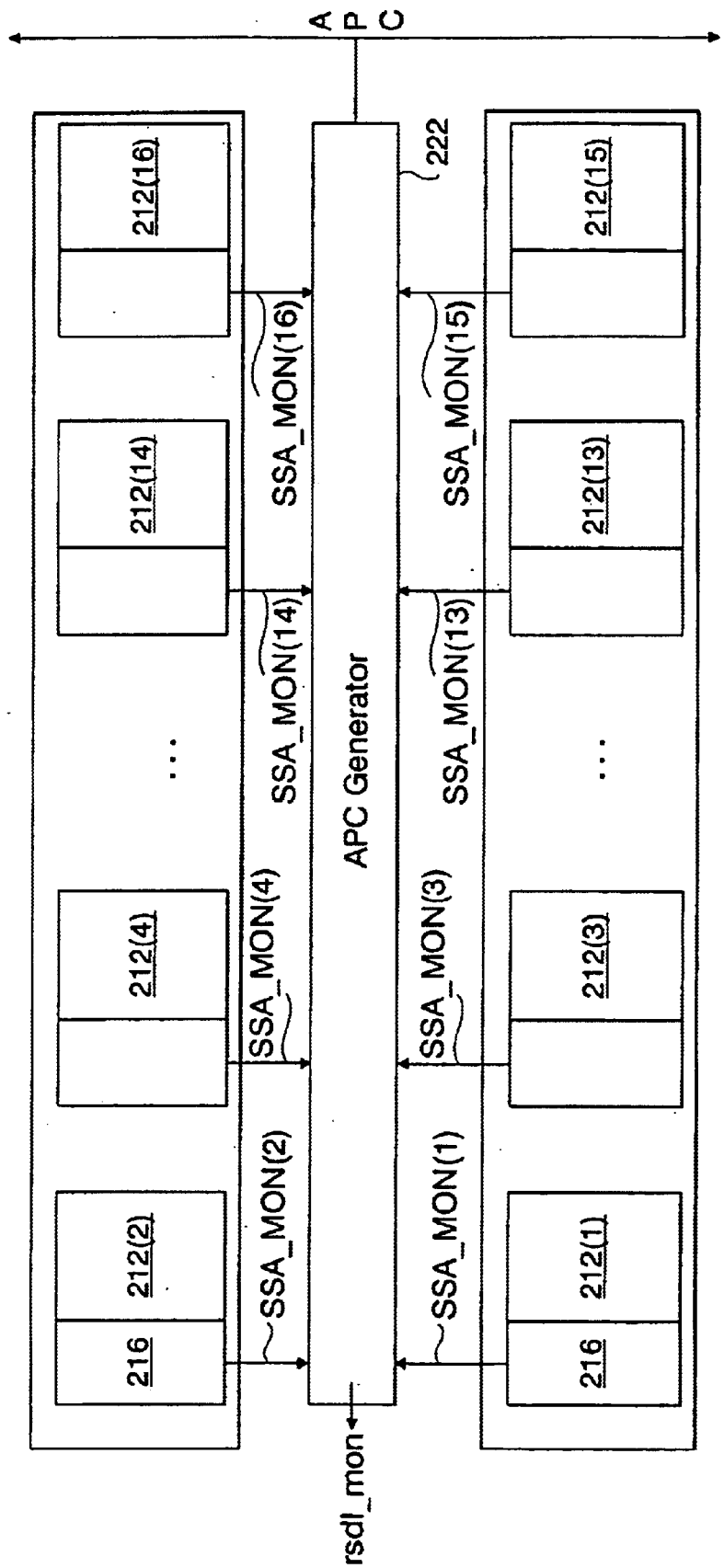
FIG. 4 is a block diagram of an arm pre-charge (APC) pulse generator according to the present invention.

The SSA blocks 212(1–16) and the APC pulse generator 222 of one of the arm regions 22r are shown in FIG. 4. The SSA blocks 212(1,3,5,7,9,11,13,15) associated with the banks 204 of array 18a form an upper bank of SSA blocks, and the SSA blocks 212(2,4,6,8,10,12,14,16) associated with the banks 204 of array 18b form a lower bank of SSA blocks. The SSA monitor 216 of each of the SSA blocks 212(n) is in communication with the APC pulse generator 222 for providing an SSA_mon(n) pulse signal. During a read operation, one of the 16 banks 204 of the arm 22r is activated for a read. The SSA block 212(n) corresponding to the bank 204 activated for the read provides an SSA_mon (n) pulse signal to the APC pulse generator 222 for triggering the APC pulse generator 222 to output the APC pulse signal as needed for timing the transfer of the charge on the datalines armdlr(1–152) and pre-charging of the data lines armdlr(1–152) for preparing them for the next read operation.

The APC pulse generator 222 is shown in greater detail in FIG. 5A. An APC pulse generator circuit 501 within the APC pulse generator 222 includes eight connected discharge blocks 502(n), where n=1 to 8. Each discharge block 502(n) includes a pair of discharge devices 504a,b, respectively. Each discharge device 504a,b is typically an nMOS FET. Each discharge device 504a receives an SSA_mon(n) pulse signal from the SSA monitor 116 of a respective one of blocks 212(2,4,6,8,10,12,14,16), and each discharge device 504b receives an SSA_mon(n) pulse signal from the SSA monitor 216 of a respective one of SSA blocks 212(1,3,5, 7,9,11,13,15). In each discharge block 502(n), the output of each of the discharge devices 504a,b, respectively, is joined at node Y.

An APCG signal line 508 passes through node A before entering discharge block 502(8). The APCG signal line 508 passes through each discharge block 502(8 to 1) sequentially, connecting node Y of each respective discharge block 502(8 to 1). A resistive element 510 is provided on the APCG signal line 508 before and after each node Y. The resistivity of the different resistive elements 510 may vary. The APCG signal line 508 passes through node B upon exiting discharge block 502(1), after which the APCG signal line 508 passes sequentially through a first inverter 514, a resistive line element 518, a second inverter 522, an "OR" gate 526, an "AND" gate 530 and a pair of inverters 534. The output of the inverter pair 534 is the APC pulse signal, which is provided to the pre-charge devices 302 associated with the data lines armdlr(1–152) and to a pre-charge device 540 connected to node A. Thus, the APC pulse signal is provided as a feedback signal to circuit 501.

The APC pulse signal controls the pre-charge device 540 for pre-charging the APCG signal line 508 and the data lines armdlr(1–152). When the APC pulse signal is "low", the pre-charge devices 540 and 306 are activated to cause pre-charging. When the APC pulse signal is "high", the pre-charge devices 540 and 306 are disabled, and pre-charging is prevented.

Figure 5B:
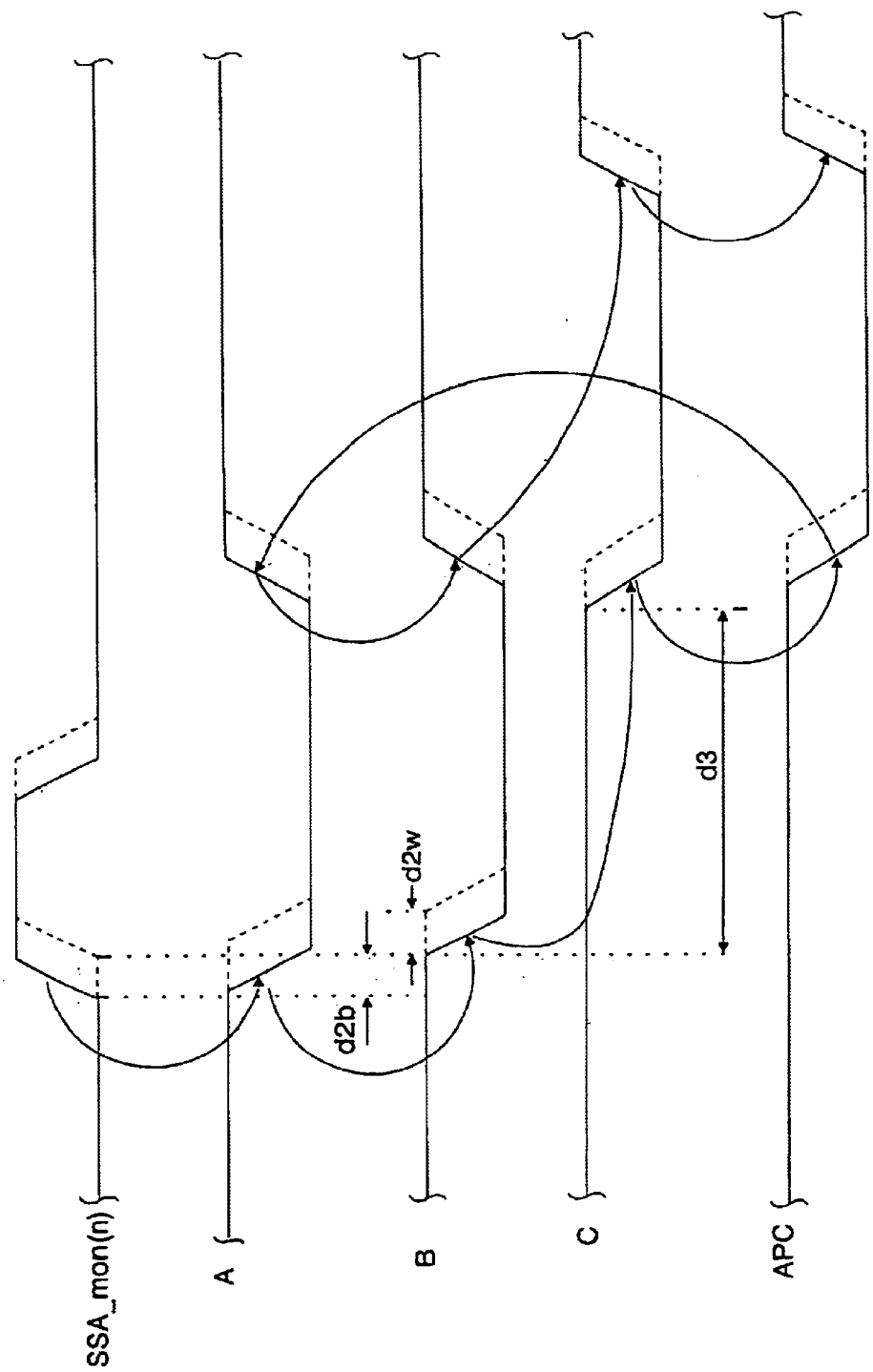
FIG. 5B is a wave form diagram of signals generated within the APC pulse generator according to the present invention.

FIG. 5B shows the waveforms of two exemplary received SSA_mon(n) pulse signals and the signals passing through the APCG signal line 508 as they pass through nodes A, B and are output as the APC pulse signal. The pulse signals shown with a solid line represent the SSA_mon(2) pulse signal received by the discharge block located nearest to the shoulder region 30, and the resulting signals passing through the APCG signal line 508, i.e. best case. The pulse signals shown with a dotted line represent the SSA_mon(15) pulse signal received by the discharge block located farthest from the shoulder region 30, and the resulting signals passing through the APCG signal line 508, i.e. worst case. As shown, the SSA_mon(n) pulse signal is an active "high" pulse signal, and the APC pulse signal and signals at nodes B and C are active "low" pulse signals.

With reference to FIGS. 5A and 5B, operation of the APC pulse generator 222 and the waveforms generated will now be described. During a power-on period, when DC generators associated with the eDRAM have established acceptable DC levels, a PWRON signal is issued (e.g., swinging from "low" to "high"). Prior to the PWRON signal going "high", the APC pulse signal is kept at "low", and the data lines armdlr(1–152) and the APCG signal line 508 are pre-charged, assuming that a Vdd level is already set. Thus, the data lines armdlr (1–152) and the APCG signal line 508 are initialized to "high" for preventing a loss of data during an initial read operation.

Once DC levels are established, the APC pulse signal remains "high", preventing pre-charging of data lines armdlr (1–152) and the APCG signal line 508, until the output of the "OR" gate 526 falls to "low". Pre-charging occurs only when a read operation is not occurring (i.e., all of the received SSA_mon(1–16) pulse signals are "low", and the signal at node C is "low").

Upon receipt of an SSA_mon(n) pulse signal, the SSA_mon dlr 219(n) through which the SSA_mon(n) pulse signal passes is immediately discharged by one of the discharge devices 504a,b, causing the signal passing through nodes A and B to fall to low. As the signal discharged by the device 540a,b is propagated to node B, the signal is delayed by a delay d2. The delay d2 is dependent upon the resistivity of the resistive elements 510 and the quantity of resistive elements 510 the signal passes through. The delay d2 is determined by the position of the discharge block 502(n) from which the discharge signal is discharged relative to the shoulder region 30, i.e., the closer the discharge block 502(n) is to the shoulder region, the shorter the delay d2. Thus, delay d2 is variable, dependent upon the location of the discharge block 502(n) that discharges a signal.

The delay d2 is d2b for best case, i.e., the SSA_mon(2) pulse signal being discharged, until the signal at node B falls due to one of the resistive elements 510 in the discharge blocks 502(1) through which the discharge signal is propagated. The delay d2 is d2w for the worst case, i.e., SSA_mon(15) pulse signal being discharged, until the signal at node B falls due to the resistive elements 510 in the discharge blocks 502(1–8) through which the discharge signal is propagated. Delay d2w is greater than delay d2b because in the worst case, scenario, the discharge signal propagated from discharge block 502(8) passes through a greater number of resistive elements 510 than the discharge signal propagated from discharge block 502(1). The signal passing through node B is output as the rsdl_mon pulse signal, as an active "low" signal to one of the shoulder regions 30 of central spine 26.

The signal propagating from node B to node C is delayed by the delay d3 due to the resistive element 518. Delay d3 is substantially the same for the worst and best cases. The resistivity value of resistive line 518 is selected for providing a delay d3 that allows pre-charging to occur after data has been transferred during a read operation. It is desirable to select a resistivity value for resistive line 518 so that the delay d3 provided is sufficient for allowing all data being read from the discharge block 502(8) located furthest from the shoulder region 30, i.e., the worst case, and as short as possible for allowing data to be read from the discharge block 502(1) located nearest to the shoulder region, i.e., best case, without wasting time.

Upon the signal at node C falling to a "low" level, during a period when a read operation is not taking place and no SSA_mon(n) pulse signals are received, the APC pulse signal falls to a "low" level. While the APC pulse signal is at a "low" level, a pre-charge interval occurs. During the pre-charge interval nodes A, B and C are subsequently charged to Vdd (the voltage of the power supply).

In the best case scenario, in which data being read is located in a bank 204 located nearest to the shoulder region 30, the delay d3 insures that sufficient time is provided for a complete transfer of the data being read. Since delay d2b is minimal in best case scenario, time is not wasted before allowing a pre-charging to occur. In the worse case scenario, in which data being read is located in a bank 204 located relatively farther from the shoulder region 30, delay d3 plus a delay d2w relatively longer than delay d2b, insures that sufficient time is provided for a complete transfer of the data being read, including the amount of time needed for the data being read to be propagated through a greater length of data line armdlr(n) and greater number of resistive elements 310 than in the best case scenario. Thus, the timing of allowing the APC pulse signal to fall to a "low" level provided by variable delay d2 and fixed delay d3 insures that sufficient time is allowed for data transfer for reading data before allowing a pre-charging of the APCG signal line 508 and the data lines armdlr(1–152) to occur, regardless of whether the data being read is stored in a location near or far from the shoulder region 30, without wasting time when the data is stored in a location closer to the shoulder region 30.

The timing of beginning the pre-charge interval depends upon the timing of providing a "low" signal at node C while no SSA_mon(n) signal pulses are being received. The signal at node C falls to "low" after the delay d3 created by resistive line 518 when the signal level at node B is "low".

The duration of the pre-charge interval depends upon the duration of the period that the signal at node C remains "low" while no SSA_mon(n) signal pulses are being received. It is desirable for the pre-charge interval to terminate after a sufficient amount of time for pre-charging the data path, and early enough so that pre-charging is not occurring upon commencement of a subsequent read operation.

Upon the occurrence of the signal at node C falling to "low" while no SSA_mon(n) signal pulses are being received, the APC signal falls to "low", causing pre-charging of APCG signal line 508. Upon pre-charging, the signal at node A rises to "high", then after the delay d2w the signal at node B rises to "high", then after the delay d3 the signal at node C rises to "high" causing the APC signal to rise to "high", terminating the pre-charge interval. The APCG signal line 508 and data lines armdlr(1–152) of the read data path 226 are pre-charged and in a ready state for a subsequent read operation, and no further pre-charging can occur prior to a subsequent read operation for preventing corruption of the subsequent read operation.

Thus, prior to an occurrence of a read operation each arm region 22 is in a ready state in which the read data path 226 and the APCG signal line 508 pre-charged and further pre-charging is prevented by keeping the APC signal at "high". Upon occurrence of a read operation the data being read is transferred via discharge devices 306 to the read data path 226, the APC pulse generator 222 controls pre-charging of the read data path 226 and the APCG signal line 508 via the APC signal, and the timing thereof via delays d2 and d3, for resetting the arm region 22 to the ready state. The circuitry within the APC pulse generator 222 is self-resetting due to receipt by the APC pulse generator 222 of the APC signal as a feedback signal for controlling data transfer and resetting of the arm region 22. Furthermore, generation of the APC signal by the APC pulse generator 222 is dynamically delayed by delays d2 and d3, where d3 varies in accordance with the location of the data bank from which data is being read.

Figure 8A:
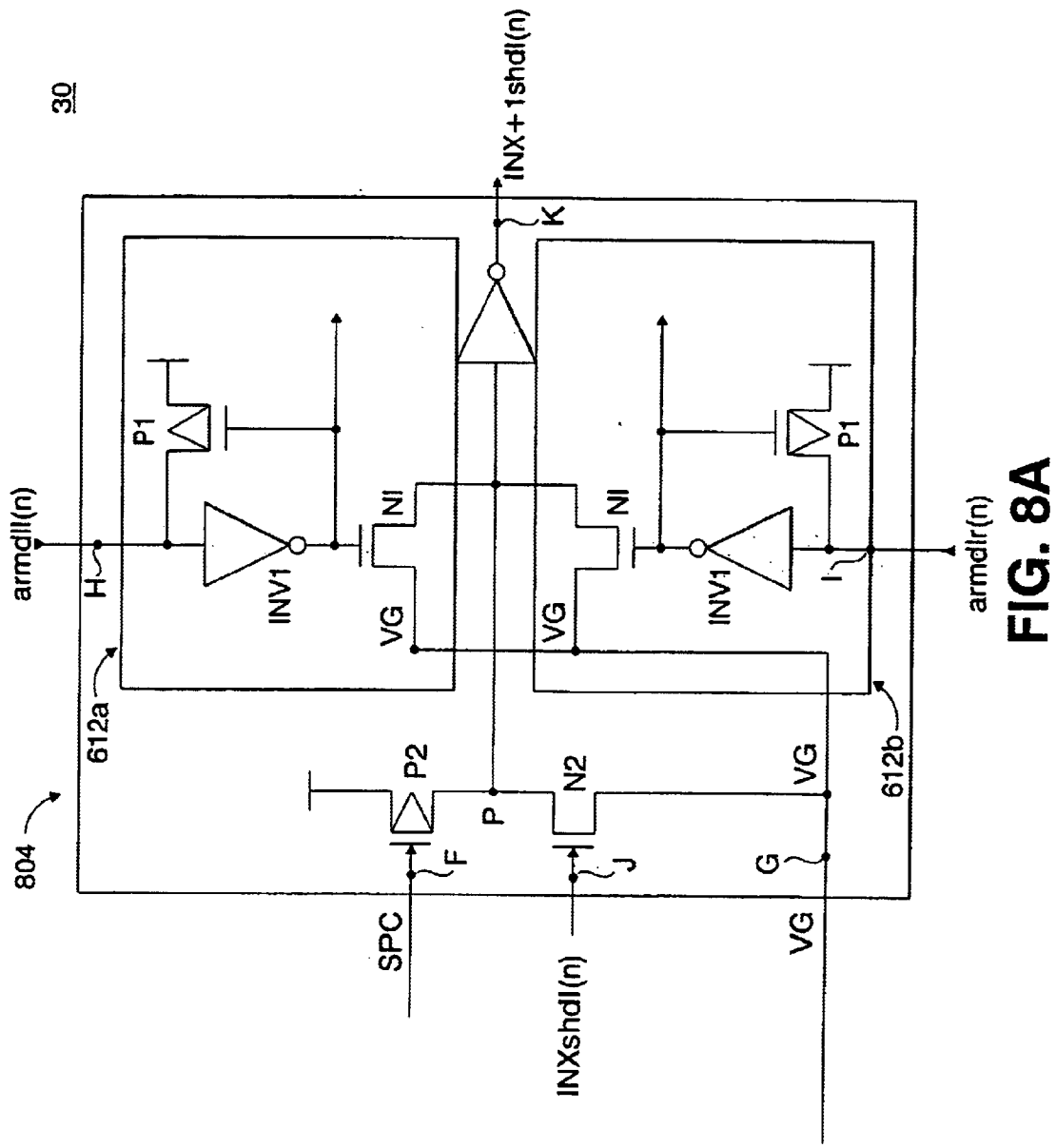
FIG. 8A is a block circuit diagram of a data line dynamic switch circuit according to the present invention.
Figure 8B:
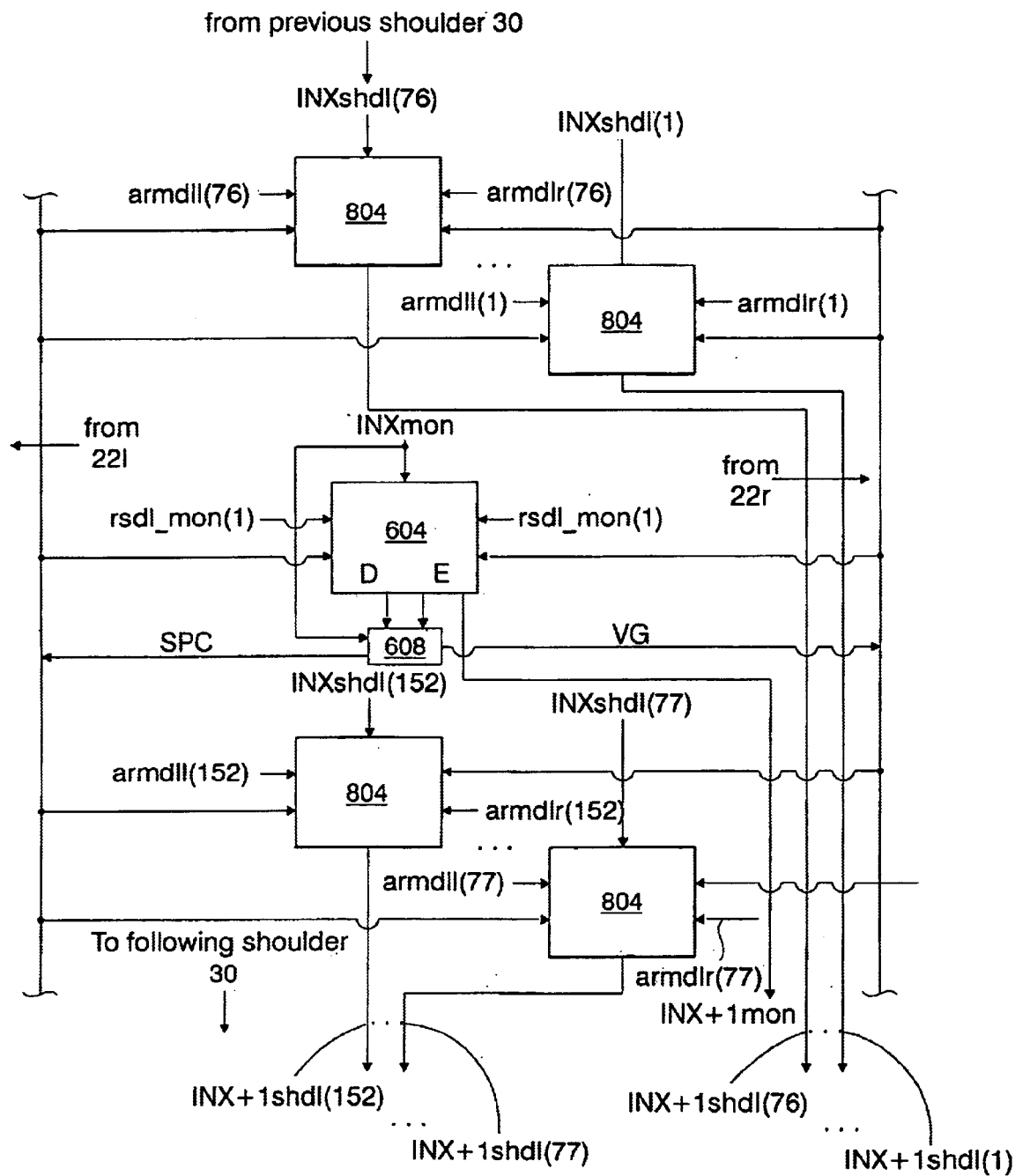
FIG. 8B is a block circuit diagram of the data line dynamic switch circuits and monitor signal dynamic switch circuits of an upper and lower array of a block in a micro-cell DRAM array according to the present invention.
Figure 9:
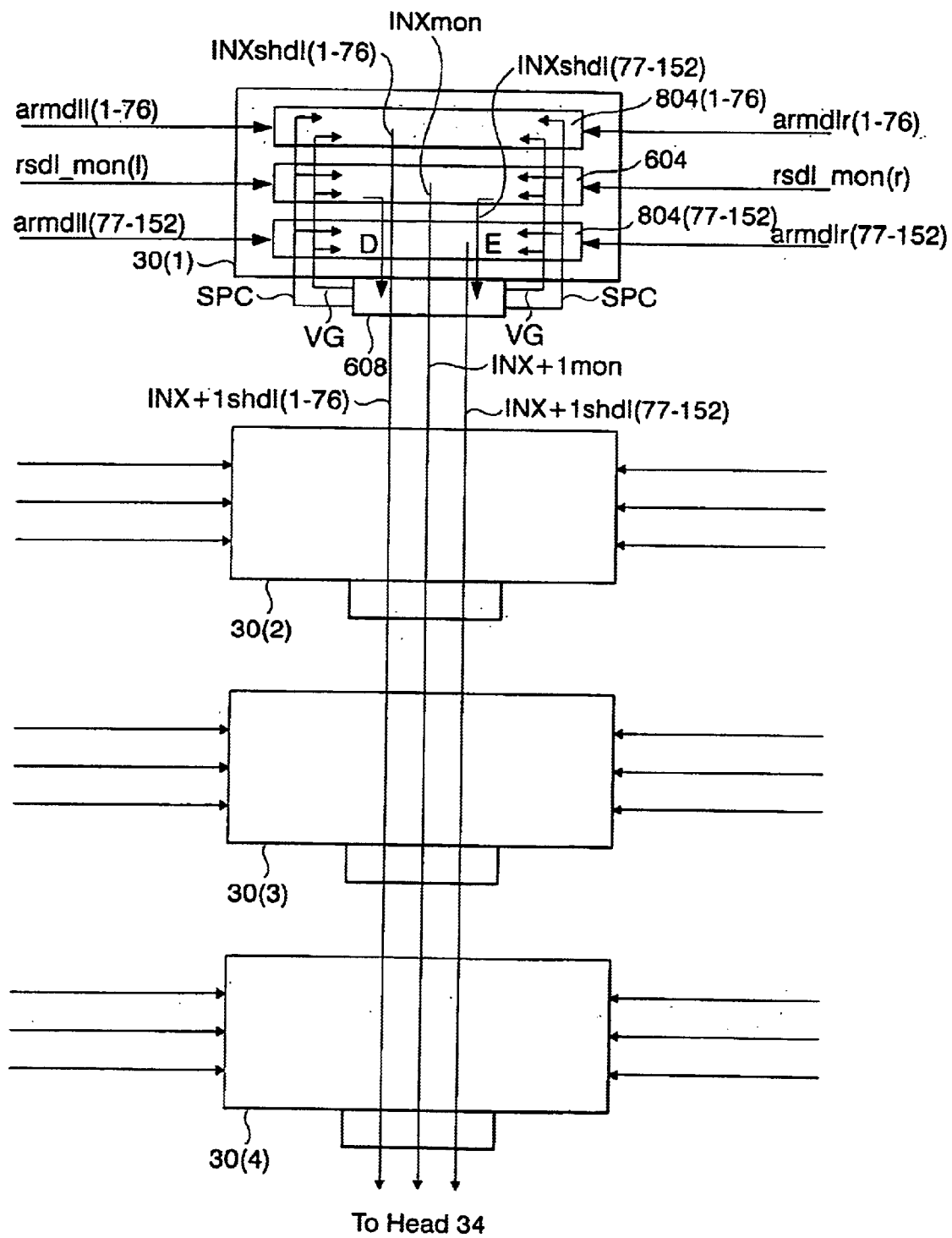
FIG. 9 is a block diagram of a dynamic read data path in arm and spine regions of a micro-cell DRAM array according to the present invention.

Transfer of data from an arm region 22 to one of the shoulder regions 30 and ultimately to the head region 34 is shown in FIGS. 6–9. FIGS. 6–8C show dynamic data lines and monitor signal lines in one of the shoulder regions 30. Circuitry is shown within the shoulder region 30 for receiving monitor and data signals during a read operation from an adjacent right or left arm region 22r,l, respectively, or a previous shoulder region 30 located above; transferring the monitor signal and data signals to the following shoulder located below; and pre-charging the data lines and monitor lines from which signals were received in preparation for a next read operation. FIG. 9 shows the flow of data and control signals through all of the shoulder regions 30 to the head region 34.

As described above, during a read operation the arm region 22r or 22l associated with a bank receiving a read signal responds by providing the data being read to data lines armdll(1 to 152) or armdlr(1 to 152) and providing an rsdl_mon pulse signal to the adjacent shoulder region 30. Thus, each shoulder region 30 must be prepared at any time (other than while processing data received) to receive a monitor signal and data signals from either the previous shoulder region 30 or the adjacent right arm region 22r or left arm region 22l; to provide the data and monitor signal to the following shoulder region 30 below it (or to the head region 34 in the case of a bottom shoulder region 30B); and to pre-charge the signal and data lines from which it received the monitor signal and the data signals.

Figure 6:
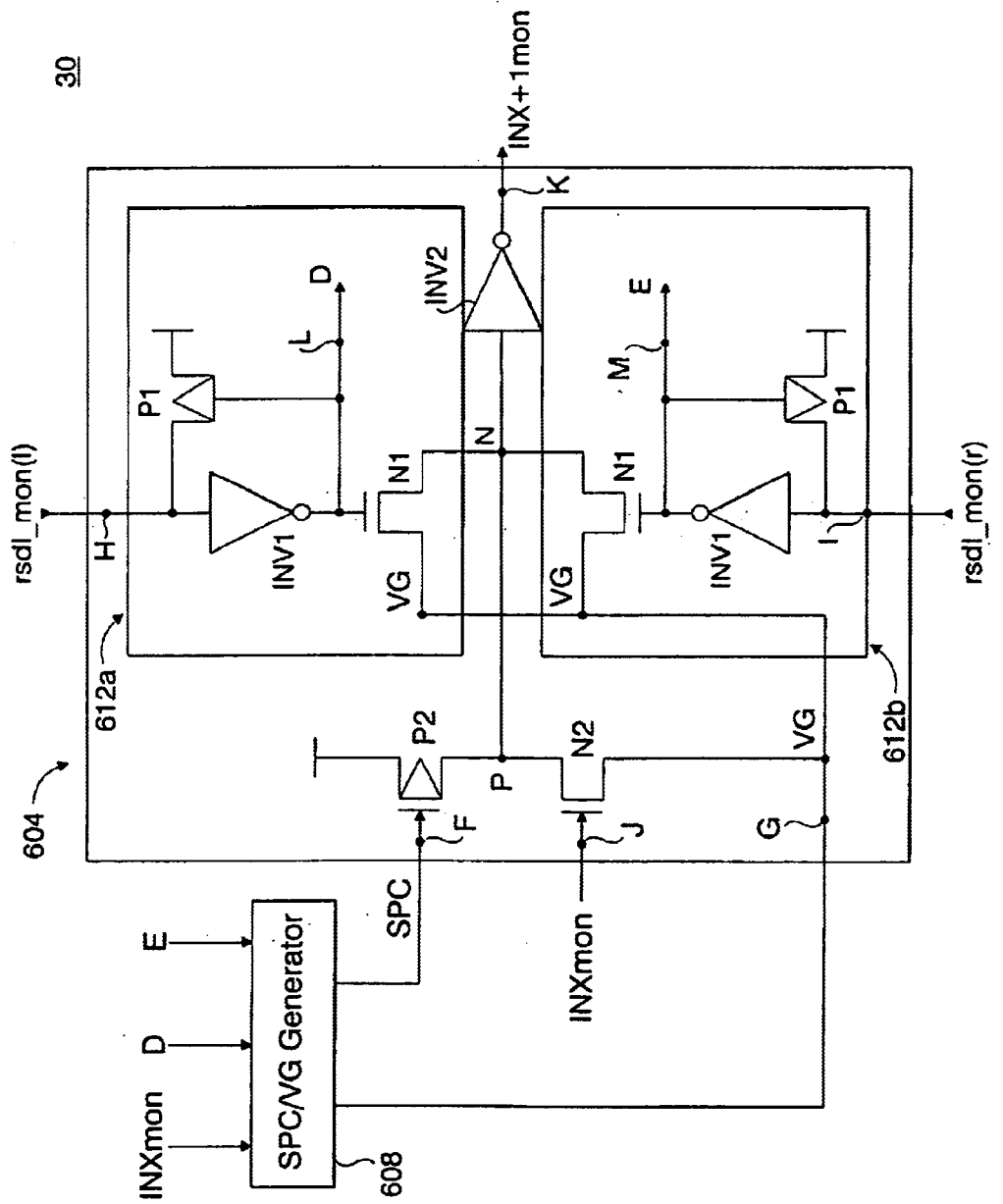
FIG. 6 is a block circuit diagram of an SPC/VG pulse generator and a monitor signal dynamic switch circuit according to the present invention.

Referring to FIG. 6, a circuit block diagram of a monitor line (ML) dynamic switch circuit 604 and a spine pre-charge (SPC) signal pulse generator 608 in one of the shoulder regions 30 is shown. The ML dynamic switch circuit 604 receives as inputs the rsdl_mon(l) and rsdl_mon(r) active "low" pulse signals provided by the APC pulse generators 222 flanking the shoulder region 30, and a monitor signal INXmon, an active "high" pulse signal provided at input nodes H, I and J, respectively. INXmon is a monitor signal from a shoulder region 30 located above the shoulder region 30 shown.

The ML dynamic switch circuit 604 outputs at output node K a monitor signal INX+1mon, an active "high" pulse signal that will be provided as an input signal INXmon to the shoulder region 30 located below the shoulder region 30 shown. Feedback signals D and E are active "high" pulse signals, which are output from output nodes L and M, respectively.

The SPC signal pulse generator 608 receives input monitor signals INXmon, D, and E, where D and E are provided as feedback signals that are output by the ML dynamic switch circuit 604. Each of the input signals INXmon, D and E are active "high" signals, and signals D and E are pulse signals. The SPC signal pulse generator 608 outputs the control signal SPC and a ground signal VG which are provided as inputs to the ML dynamic switch circuit 604 at input nodes F and G, respectively. The signals SPC and VG are pulse signals, where SPC is active high and VG is active low, as will be described below with reference to FIG. 7B.

The ML dynamic switch circuit 604 includes symmetric circuit portions 612a and 612b. Referring to portion 612a, the input node H, at which the rsdl_mon(l) pulse signal is provided as an input from a left arm 22l, is connected by a signal line to inverter INV1 that is connected to discharge device N1. The output of discharge device N1 is output from the circuit portion 612a. The output of inverter INV1 is connected to output node L, from which feedback signal D is output, and to the gate of a pre-charge device P1 which is connected to the signal line connecting the input node H to the inverter INV1. It is to be understood that circuit portion 612b is substantially the same as and symmetric to circuit portion 612a, except the input signal rsdl_mon(r) now is from a monitor signal input from a right arm 22r. The outputs of discharge devices N1 from circuit portions 612a,b are connected at node N.

The ML dynamic switch circuit 604 further includes a discharge device N2 having its gate connected to the input node J, at which the signal INXmon is provided as an input. The output of discharge device N2 is connected to nodes N and P. Node N is connected to an inverter INV2 whose output is connected to output node K, from which the signal INX+1mon is output. A pre-charge device P2 is provided with its gate connected to input node F, at which the SPC pulse signal is provided as an input, and its output connected to node P. The drain of discharge devices N1, N2 are connected to input node G, at which the signal VG is provided as an input. The discharge devices N1, N2 are typically nMOS FETs. Pre-charge devices P1, P2 are typically pMOS FETs.

Figure 7A:
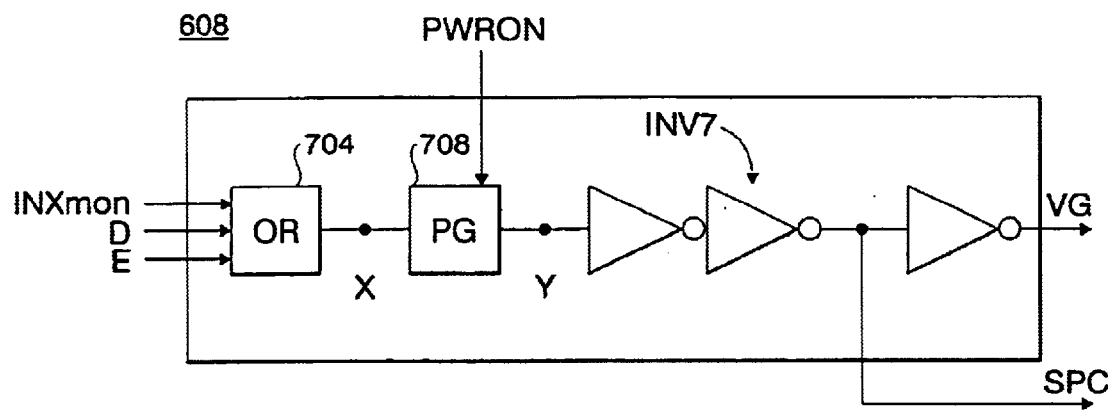
FIG. 7A is a block circuit diagram of the SPC/VG pulse generator according to the present invention.
Figure 7B:
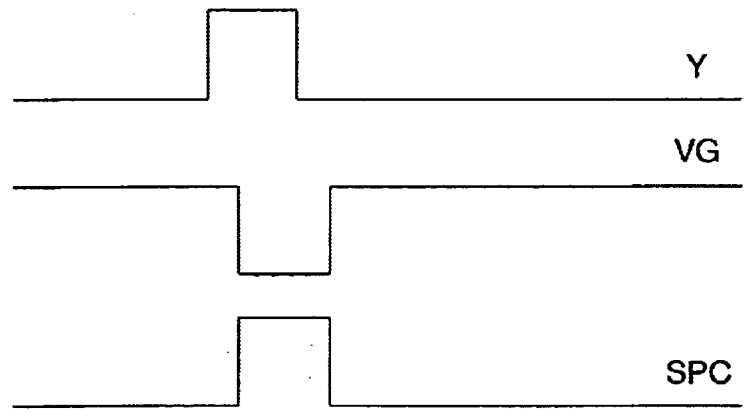
FIG. 7B is a wave form diagram of signals generated by the SPC/VG pulse generator according to the present invention.

Referring to FIG. 7A, a circuit block diagram of the SPC/VG pulse generator 608 is shown. The input signals INXmon, D and E, are provided to an OR gate 704 which outputs signal X. Signal X is provided to a pulse generator (PG) circuit 708 which outputs signal Y. The PWRON signal is further provided to the PG circuit 708. Signal Y is output to a series of three inverters INV7, which outputs the VG signal. The second inverter of the series of inverters INV7 outputs control pulse signal SPC. The waveforms for the signals Y, VG and SPC generated by the SPC/VG pulse generator 608 is shown by FIG. 7B. As shown, pulses of signals SPC and VG are slightly delayed from a pulse of signal Y, and VG is inverted relative to SPC, where SPC is an active "high" pulse signal and VG is an active "low" pulse signal.

FIGS. 8A,B show the circuits for transferring data and pre-charging data lines within one of the shoulder regions 30 during a read operation. As seen in FIG. 8B, 152 DL dynamic switch circuits 804 are provided for transferring data from one of the arm regions 22l or 22r flanking the shoulder region 30, or from the previous shoulder region 30, to the following shoulder region 30, and pre-charging the data lines through which the data was transferred in order for the data lines to be ready for a next read operation.

FIG. 8A shows a circuit diagram of an exemplary data line (DL) dynamic switch circuit 804. The DL dynamic switch circuit 804 is the same as the ML dynamic switch circuit 604, with the exception that output nodes L and M are omitted. Thus discharge devices N1, N2, pre-charge devices P1, P2, inverters INV1, INV2 all operate in the same way in relationship to the inputs provided at input nodes F, G, H, I and J and the output provided from node K.

With respect to DL dynamic switch circuit 804, input signals SPC, VG, armdlr(n), armdll(n), INXshdl(n), are provided to input nodes F, G, H, I and J, respectively, wherein SPC and VG are provided from the SPC/VG pulse generator 608, armdlr(n) and armdll(n) are each one data line from 152 data lines provided from the arm region 22 to the shoulder region 30 shown, and INXshdl(n) is one shoulder data line from 152 shoulder data lines provided from the shoulder region 30 located above the shoulder region 30 shown (i.e., previous shoulder region). The DL dynamic switch circuit 804 outputs INX+1shdl(n), which is provided to the shoulder data line of the following shoulder region 30 located below the shoulder region 30 shown as INXshdl(n). In each of the shoulder regions 30, one DL dynamic switch circuit 804 is provided for each of the 152 shoulder data lines.

FIG. 8B shows one shoulder region 30 receiving an INXmon pulse signal and INXshdl(1 to 152) signals from the previous shoulder region, rsdl_mon(l) and rsdl_mon(r) monitor pulse signals from left and right arm regions 22l, 22r, respectively, flanking the shoulder region 30 shown, and armdll(1 to 152) and armdlr(1 to 152) from the left and right arm regions 22, respectively, flanking the shoulder region 30 shown. In an upper section of the shoulder region 30 shown, 76 dynamic switch circuits 804 are provided for receiving, discharging for transmission to the following shoulder region 30, and pre-charging armdll(1 to 76), armdlr(1 to 76) and INXshdl(1 to 76), below which ML dynamic switch circuit 604 and SPC/VG pulse generator 608 are provided, and below which another 76 DL dynamic switch circuits 804 are provided for receiving, discharging for transmission to the following shoulder region 30, and pre-charging armdll(77–152), armdlr(77–152) and INXshdl (77–152).

The top shoulder region 30T does not receive data or monitor signals from a previous shoulder region 30. Thus, in one embodiment it is possible for the top shoulder region 30T to omit in the ML dynamic switch circuit 604 the input node J associated with input signals INXmon, discharge device N2 and pre-charge device P2, and in each ML dynamic switch circuit 804 node J associated with INXshdl (n), and an input port for the INXmon input to OR gate 704, or alternatively the INXmon and INXshdl(n) signals may be provided each as a steady "low" signal.

The operation of dynamic switch circuits 604, 804 and SPG/VG pulse generator 608 will now be described. Receipt of a monitor signal rsdl_mon(l), rsdl_mon(r), or INXmon by a shoulder region 30 indicates that data from a read operation is ready to be transferred through the shoulder region 30. Upon receipt of an INXmon signal, the SPC/VG pulse generator 608 generates an SPC pulse signal for preventing pre-charging of incoming monitor and data lines from the previous shoulder region 30 for the duration of the pulse of the SPC pulse signal. Furthermore, upon receipt of either the rsdl_mon(l) or rsdl_mon(r) pulse signals, which are "low" active signals, the pulse is inverted by inverter INV2, and the inverted "high" active pulse is output as signal D or E, respectively, and provided to the SPC/VG pulse generator 608, causing generation of an SPC pulse signal for preventing pre-charging of incoming monitor and data lines from the previous shoulder region 30 for the duration of the pulse of the SPC pulse signal and therefore during receipt of the monitor signals rsdl_mon(r), rsdl_ mon(l) or INXmon, or data signals armdll(n), armdlr(n) or INXshdl(n).

The received monitor signal rsdl_mon(l), rsdl_mon(r), or INXmon is further processed for transmitting a monitor signal INX+1mon to the following shoulder region 30. For a received monitor signal rsdl_mon(l) or rsdl_mon(r), the received monitor signal is processed by circuit 612a, 612b, respectively to invert the received monitor signal by inverter INV1 to form an active "high" signal and discharge the inverted signal by discharge device N1 as an active "low" signal and output to node N of ML dynamic switch circuit 604. Similarly, for a received "high" active monitor signal INXmon, the monitor signal is discharged by discharge device N2 as an active "low" signal and output to node N of ML dynamic switch circuit 604. The signal received at node N is inverted by inverter INV2 and output as a "high" active signal to the following shoulder region 30. The signal line carrying the rsdl_mon(l) or rsdl_mon(r) signal is pre-charged by pre-charge device P1 once the active low pulse of the received monitor signal is terminated. As mentioned above, the signal line carrying the INXmon signal is pre-charged by pre-charge device P2 upon termination of the SPC pulse.

The data signals received are processed similarly to the processing of the monitor signals described above. Each received data signal armdll(n), armdlr(n) or INXshdl(n) is processed for transmitting a data signal INX+1shdl(n) to the following shoulder region 30. For a received data signal armdll(n), armdlr(n), the received data signal is processed by circuits 612a, 612b, respectively, to invert the received data signal by inverter INV1 to form an active "high" signal and discharge the inverted signal by discharge device N1 as an active "low" signal and output to node N of DL dynamic switch circuit 804. Similarly, for a received "high" active data signal INXshdl(n), the data signal is discharged by discharge device N2 as an active "low" signal and output to node N of DL dynamic switch circuit 804. The signal received at node N is inverted by inverter INV2 and output as a "high" active signal INX+1shdl(n) to the following shoulder region 30. The data line carrying data signal armdll(n), armdlr(n) is pre-charged by pre-charge device P2 once the received monitor signal is inverted by inverter INV1. As mentioned above, the data line carrying the INXshdl(n) signal is pre-charged by pre-charge device P2 upon termination of the SPC pulse.

As described above, the SPC/VG pulse generator 608 in shoulder region 30 generates a "high" SPC pulse signal upon receipt of a "high" active INXmon, D or E signal. The "high" active pulse signal SPC is provided to pre-charge device P2 of each dynamic switch circuit 604 and 804 for controlling the timing of beginning a pre-charge of the incoming data and monitor lines from the shoulder region 30 located above the particular shoulder region 30. While the pulse signal SPC is "high", device P2 is prevented from pre-charging. Upon the pulse signal SPC falling to "low", pre-charging is allowed. The falling edge of the pulse signal SPC triggers the beginning of a pre-charge phase for preparing for the next read operation. Due to an existing heavy load of pre-charge devices, the pulse of signal SPC has a tendency to grow wider during propagation of monitor signals and data signals through the spine 26. Were the pulse of the SPC pulse signal allowed to grow in width, pre-charging of shoulder data lines shdl(1 to 152) and the signal line carrying the INXmon pulse signal would be delayed. The SPC/VG pulse generator 608 is therefore provided with PG 708 for generating a pulse to form a uniform pulse signal SPC. Thus, the PG 708 guarantees that the trailing edge of pulse signal SPC will be a fixed time following the leading edge of the pulse, and pre-charging will not be delayed.

Discharge devices, such as devices N1 and N2 shown in FIGS. 6 and 8A, are typically connected to a ground for sinking current during a discharge operation and preventing DC leakage. Due to congestion of data lines in the shoulder region 30, it is not practical to provide a ground line to the shoulder region 30, as such a ground line tends to be thick, or another pull down device provided in series. The ground provided for devices N1 and N2, as shown in FIGS. 6, 7 and 8A, is a virtual ground which is an inverted SPC signal provided by the SPC/VG pulse generator 608. The VG and SPC pulse signals are generated almost simultaneously, as both are required for performing data line discharge operation during a read (i.e. evaluation) period. The slight timing difference between the SPC and VG pulse signals has no effect on the data line discharge operation. The VG signal is brought to a "low" level during read periods in which the SPC signal is high for preventing pre-charging and the discharge devices N1 and N2 are discharging the corresponding data and signal lines carrying data signals being read and monitor signals. Any desired pull-down devices, voltage sources or grounds can thus be located in a location remote from congested areas such as the shoulder regions 30.

FIG. 9 shows the flow of data and monitor signals through a series of four shoulders 30(1–4). Each shoulder 30(n) has one ML dynamic switch circuit 604, and 152 dynamic switch circuits 804(1 to 152). As shown, data is transferred between the shoulder 30(4) and the head region 34.

It is to be understood that data and control signals such as monitor signals are transferred between the head region 34 and the shoulder 30(1) located adjacent to the head. Furthermore, it is to be understood that pulse signals may be negative or positive pulse signals and the circuitry generator and receiving the pulse signal may be designed accordingly.

In summary, the present invention provides a wave-pipe operation in which a monitor signal provided by SSA's sensing data being read is provided to the APC pulse generator 222 of an arm $22r,l$ having a self-resetting circuit that insures all data being read is transferred through the arm region $22r,l$ after which data lines armdll,r(n) are pre-charged in preparation for the next wave of data, as well as generating a monitor signal to the spine 26 indicating that data is being transferred from the arm region $22r,l$ to the spine 26. The self-resetting circuit delays pre-charging of data and monitor lines for resetting the circuit in accordance with the location of the memory bank from which data is being read. Thus, time is not wasted when data is read from a near location, and sufficient time is provided when data is read from a far location.

Furthermore, the wave-pipe operation provides transfer of data from multiple arm regions $22r,l$ through a central spine 26 to a control region. The central spine 26 is provided with multiple shoulder regions 30 having circuits for receiving data and monitor signals from multiple arm regions $22r,l$ that insure all data being read is completely transferred through the central spine 26 after which data lines INXshdl(n), and armdll,r(n) in the shoulder regions 30 are pre-charged in preparation for the next wave of data. A next wave of data can be processed by an arm region $22r,l$ while the spine 26 is still processing the first wave of data. In addition, a pulse generator is used to regulate resetting of data lines in the shoulder regions 30 via pre-charging them after a read operation. Furthermore, a virtual ground is provided in the shoulder regions 30 during evaluation periods only, for minimizing unnecessary current flow and occupying as little space as possible in congested areas.

What has been described herein is merely illustrative of the application of the principles of the present invention. For example, the systems described above and implemented as the best mode for operating the present invention are for illustration purposes only. In other words, other arrangements and methods may be implemented by those skilled in the art without departing from the scope and spirit of this invention.

We claim:

1. A data communication system for a semiconductor memory system having at least one data path, the data communication system comprising:
   a central data path including at least one junction circuit configured for exchanging data signals between the central data path and at least one data path of the at least one data path;
   a respective one junction circuit of the at least one junction circuit including means for controlling resetting the respective one junction circuit for preparation of a subsequent data transfer through the respective one junction circuit in accordance with receipt of an input monitor signal indicating that data has been transferred to the respective one junction circuit.

2. The data communication system of claim 1, wherein the means for controlling resetting prevents resetting of the respective one junction circuit when data is being received by the respective one junction circuit.

3. The data communication system of claim 1, wherein the data communication system includes a plurality of data banks configured for storing data, and a corresponding data bank of the plurality of data banks is connected to a respective one data path of the at least one data path, the data communication system including:

means for controlling the respective one data path in accordance with receipt of a monitor signal indicating that a data transfer operation has been initiated for transfer of data to the respective one data path, the means for controlling including a means for generating a control signal for controlling resetting of the respective one data path after data is transferred for preparation of a subsequent data transfer operation.

4. The data communication system of claim 3, wherein the control signal is provided to the means for generating the control signal as a feedback signal.

5. The data communication system of claim 1, wherein the input monitor signal indicates that a plurality of data signals are being transferred to the respective one junction circuit, and wherein the respective one junction circuit outputs an output monitor signal indicating that the plurality of data signals are being transferred from the respective one junction circuit.

6. The data communication system of claim 5, wherein the respective one junction circuit includes a plurality of junction data lines for at least one of processing, receiving and transferring at least one of the input monitor signal, the plurality of data signals, and the output monitor signal.

7. The data communication system of claim 6, wherein the plurality of junction data lines includes a plurality of input data signal lines and at least one input monitor signal line; and wherein the respective one junction circuit receives the input monitor signal via an input monitor signal line of the at least one input monitor signal line, and a plurality of input data signals via a group of input data signal lines of the plurality of input data signal lines.

8. The data communication system of claim 6, wherein the respective one junction circuit of the at least one junction circuit includes a plurality of output data signal lines and at least one output monitor signal line; and wherein the respective one junction circuit outputs an output monitor signal via an output monitor signal line of the at least one output monitor signal line; and a plurality of output data signals via the plurality of output data line.

9. The data communication system of claim 7, wherein the means for controlling resetting controls resetting of the input monitor signal line propagating the input monitor signal and the group of input data signal lines propagating the plurality of input data signals.

10. The data communication system of claim 7, wherein the respective one junction circuit of the at least one junction circuit includes a plurality of output data signal lines and at least one output monitor signal line;

wherein the respective one junction circuit outputs an output monitor signal via an output monitor signal lines of the at least one output monitor signal line, and a plurality of output data signals via a group of output data signal lines of the plurality of output data signal lines; and wherein the input monitor signal is received from one of a data path of the plurality of data paths and the output monitor signal line of another junction circuit of the at least one junction circuit, and the plurality of input data signals is received from one of a data path of the plurality of data paths and the group of output data signal lines of the another junction circuit of the at least one junction circuit.

11. The data communication system of claim 8, wherein the plurality of junction data lines includes a plurality of input data signal lines and at least one input monitor signal line;

wherein the respective one junction circuit receives the input monitor signal via an input monitor signal line of the at least one input monitor signal line, and a plurality of input data signals via a group of input data signal lines of the plurality of input data signal lines; and wherein the output monitor signal is transmitted to the input monitor signal line of another junction circuit of the at least one junction circuit, and the output data signals are transmitted to the group of input data signal lines of the another junction circuit.

12. The data communication system of claim 6, wherein the means for controlling resetting includes at least one reset circuit included in at least one of the plurality of junction data lines, and a control signal generator for generating a reset control signal which controls the at least one reset circuit.

13. The data communication system of claim 6, wherein a respective junction data line of the plurality of junction data lines is connected to a discharge circuit for transferring at least one of the received input monitor signal and the plurality of data signals.

14. The data communication system of claim 13, wherein the at least one discharge circuit includes a discharge device;

wherein the means for controlling resetting includes a control signal generator for generating a reset control signal which controls resetting the respective one junction circuit, and a virtual ground signal having a polarity different from the reset control signal; and wherein the virtual ground signal is applied to the discharge device.

15. The data communication system of claim 12, wherein feedback signals are provided to the control signal generator.

16. The data communication system of claim 12, wherein the reset control signal prevents resetting of the plurality of junction data lines when the plurality of data signals and the input junction monitor signal are being received or processed by the junction data lines.

17. The data communication system of claim 12, wherein the input monitor signal is a pulse signal, and the reset control signal disables the at least one reset circuit for the duration of a pulse of the input monitor signal.

18. The data communication system of claim 12, wherein the reset circuit is a pre-charge circuit.

19. The data communication system of claim 12, wherein the reset control signal is a pulse signal generated by a pulse generator.

20. The data communication system as in claim 12, wherein the pulse generator is triggered by a signal indicative of the input monitor signal.

21. A method for transferring data in a data communication system for a semiconductor memory system having at least one data path comprising the steps of:

connecting a central data path to the at least one data path at a junction circuit;

receiving data in the junction circuit;

processing the data;

transferring the data out of the junction circuit;

resetting of the junction circuit for preparation for receipt of new data; and controlling the resetting to prevent resetting while the data is being at least one of received and processed.

22. The method of claim 21, further including the steps of:
receiving an input monitor signal indicating that the data is being transferred to the junction circuit; and
outputting an output monitor signal indicating that the data is being transferred from the junction circuit.

23. The method of claim 22, wherein the step of controlling further includes the steps of:
generating a reset control signal in accordance with receipt of the input monitor signal; and
controlling via the reset control signal at least one reset circuit associated with data lines receiving data and the input monitor signal.

24. The method of claim 23, further comprising the steps of generating the reset control signal via a pulse generator; and
triggering the pulse generator by a signal indicative of the input monitor signal.

25. A data communication system for a semiconductor memory system having at least one data path, the data communication system comprising:
means for connecting a central data path to the at least one data path at a junction circuit;
means for receiving data in the junction circuit;
means for processing the data;
means for transferring the data out of the junction circuit;
means for resetting the junction circuit for preparation of receipt of new data; and
means for controlling the resetting to prevent resetting while the data is being at least one of received and processed.

26. The data communication system of claim 25, further comprising:
means for receiving an input monitor signal indicating that the data is being transferred to the junction circuit; and
means for outputting an output monitor signal indicating that the data is being transferred from the junction circuit.

27. The data communication system of claim 26, wherein the means for controlling further includes:
means for generating a reset control signal in accordance with receipt of the input monitor signal; and
means for resetting including at least one reset circuit associated with data lines receiving data and the input monitor signal controlled via the reset control signal.

28. The data communication system of claim 27, wherein the reset control signal is generated via a pulse generator, and further including means for triggering the pulse generator by a signal indicative of the input monitor signal.

* * * * *